United States Patent
Kondo

(10) Patent No.: US 6,841,336 B2
(45) Date of Patent: Jan. 11, 2005

(54) PLATE-MAKING METHOD OF LITHOGRAPHIC PRINTING PLATE

(75) Inventor: Shunichi Kondo, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 143 days.

(21) Appl. No.: 09/977,278

(22) Filed: Oct. 16, 2001

(65) Prior Publication Data

US 2002/0081527 A1 Jun. 27, 2002

(30) Foreign Application Priority Data

Oct. 16, 2000 (JP) .................................... P. 2000-315393

(51) Int. Cl.$^7$ ................................................ G03F 7/30
(52) U.S. Cl. ................. 430/302; 430/278.1; 430/281.1; 430/282.1; 430/283.1; 430/284.1; 430/286.1; 430/287.1; 430/288.1; 430/309; 430/401; 430/435; 430/494
(58) Field of Search .......................... 430/270.1, 271.1, 430/278.1, 281.1, 282.1, 283.1, 284.1, 286.1, 287.1, 288.1, 302, 309, 348, 401, 413, 415, 434, 435, 448, 494

(56) References Cited

U.S. PATENT DOCUMENTS

| 3,907,574 A | | 9/1975 | Yonezawa et al. |
| 4,716,098 A | | 12/1987 | Mack et al. |
| 4,983,498 A | * | 1/1991 | Rode et al. ............... 430/284.1 |
| 5,085,974 A | | 2/1992 | Frass et al. |
| 5,663,212 A | | 9/1997 | Wakata et al. |
| 5,837,425 A | * | 11/1998 | Nakanishi et al. ........... 430/302 |
| 6,315,467 B1 | * | 11/2001 | Oishi et al. .................. 396/578 |
| 6,364,544 B1 | * | 4/2002 | Sasayama et al. .......... 396/578 |
| 6,514,668 B1 | * | 2/2003 | Tsuji et al. ............... 430/278.1 |
| 6,558,875 B1 | * | 5/2003 | Toshimitsu et al. ......... 430/302 |

FOREIGN PATENT DOCUMENTS

| EP | 0 287 818 A2 | 10/1988 |
| EP | 0 573 805 A1 | 12/1993 |
| EP | 0 701 170 A2 | 3/1996 |
| EP | 0 949 540 A1 | 10/1999 |
| EP | 1 172 699 A1 | 1/2002 |
| JP | 11-65126 A | 3/1999 |

* cited by examiner

*Primary Examiner*—Barbara L. Gilliam
(74) *Attorney, Agent, or Firm*—Burns, Doane, Swecker & Mathis, L.L.P.

(57) ABSTRACT

A plate-making method of a lithographic printing plate comprising exposing imagewise a photosensitive lithographic printing plate comprising an aluminum support and a photosensitive layer comprising a photosensitive composition of photopolymerization type, which contains a compound having a nitrogen atom and an ethylenically unsaturated double bond, a photopolymerization initiator and a polymer binder, and developing the exposed printing plate with a developing solution containing (1) an inorganic alkali agent and (2) a nonionic surface active agent having a polyoxyalkylene ether group.

19 Claims, No Drawings

PLATE-MAKING METHOD OF LITHOGRAPHIC PRINTING PLATE

FIELD OF THE INVENTION

The present invention relates to a plate-making method of a lithographic printing plate. More specifically, it relates to a plate-making method of a lithographic printing plate that enables to prepare a printing plate free from printing stain and excellent in press life and in which safety of a developing solution, stability of developing characteristics with the lapse of time and influence of waste liquid upon the environment are improved.

BACKGROUND OF THE INVENTION

A negative-working photosensitive lithographic printing plate widely used hitherto comprises an aluminum plate subjected to hydrophilic treatment having provided thereon a diazo resin layer. In a developing solution for use in the development thereof, an organic solvent is necessarily used and thus, it is anxious for treatment of the waste developing liquid and influence thereof on the environment. On the other hand, an orthoquinone diazide compound and a novolak resin are used together in a photosensitive layer of a positive-working photosensitive lithographic printing plate, and as a developing solution therefor, an aqueous alkaline solution of silicate capable of dissolving the novolak resin is used. A pH necessary for dissolving the novolak resin is about 13 and the developing solution having such a high pH is required to be handled with sufficient caution since it is strongly stimulative when adhered to skin or mucous membrane.

As a developing solution for a lithographic printing plate having a photosensitive layer of photopolymerization type on an aluminum plate support, there is proposed an aqueous solution of a silicate, phosphate, carbonate or hydroxide of alkali metal or an organic amine compound.

For instance, a developing solution having a high pH of 12 or more and containing an alkali salt of silicic acid and an amphoteric surface active agent is described in JP-A-8-248643 (the term "JP-A" as used herein means an "unexamined published Japanese patent application") and a developing solution having a high pH of 12 or below and containing an alkali salt of silicic acid with the specified ratio of SiO2/M2O (wherein M represents an alkali metal) is described in JP-A-11-65129 . The former has a problem in that the image area tends to be damaged upon development with the developing solution having such a high pH in addition to the problem of handling as described above. The latter has a problem in that the silicate may be gelled and insolubilized upon a slight decrease in pH of the developing solution during development.

As a developing solution containing no alkali salt of silicic acid, a developing solution comprising an alkali agent, a complexing agent, anionic surface active agent, an emulsifying agent and an n-alkanoic acid is described in JP-A-61-109052 and a developing solution comprising an alkali agent, a complexing agent, an anionic surface active agent, an aminoalcohol and an N-alkoxyamine is described in West German Patent 1,984,605. However, these developing solutions damage severely the image area due to the high pH thereof or the organic solvent contained therein and thus, it is difficult to obtain printing characteristics such as press life.

As a developing solution having a relatively low pH (pH of 12 or below) and containing no alkali salt of silicic acid, an aqueous potassium hydroxide solution containing an anionic surface active agent is described in JP-A-2000-81711 and an aqueous solution of alkali metal carbonate having a pH of 8.5 to 11.5 is described in JP-A-11-65126.

Development with such a developing solution having a relatively low pH has a problem in that since the developing solution has essentially a weak power for dissolving a photosensitive layer of photopolymerization type, for example, when a printing plate of such a type which has been preserved is treated, the development proceeds only insufficiently, resulting in the occurrence of residual film. In order to solve the problem, it is requested a means, for example, that a polymer binder having a high acid value is used in the photosensitive layer of printing plate precursor for improving developability or a monomer having an acid group is used together. However, in case of using the binder having such a high acid value, another problem in printing, for example, a phenomenon in which adhesion of printing ink is disturbed during the printing (so-called blinding) tends to occur.

SUMMARY OF THE INVENTION

Therefore, the present invention aims to solve these problems described above.

Specifically, an object of the present invention is to provide a plate-making method of a lithographic printing plate wherein an alkali developing solution having a relatively low pH, which is preferred in view of environment and safety, is used, good developability is constantly achieved in the non-image area so that no stain occurs in printing and damage to the image area by the development is small to provide an image having excellent strength.

Another object of the present invention is to provide a plate-making method of a lithographic printing plate, which realizes regularly good press life.

Other objects of the present invention will become apparent from the following description.

As a result of intensive investigations to achieve the objects described above, it has been found that a dissolving speed of the photosensitive layer of photopolymerization type in the unexposed area increases and on the contrary, penetration of the developing solution is restrained in the exposed area crosslinked with the photopolymerization by using a developing solution comprising an inorganic alkali agent and a nonionic surface active agent of a specific structure.

It has been also found that when a compound having a nitrogen atom and an ethylenically unsaturated double bond in the molecule thereof such as a urethane acrylate or an N-substituted acrylamide is used as a monomer component for the photosensitive layer, the above described effects remarkably increase, whereby a lithographic printing plate having a extremely good press life is obtained to complete the present invention.

Specifically, the present invention includes a plate-making method of a lithographic printing plate, which comprises exposing imagewise a photosensitive lithographic printing plate comprising an aluminum support and a photosensitive layer comprising a photosensitive composition of photopolymerization type, which contains a compound having a nitrogen atom and an ethylenically unsaturated double bond, a photopolymerization initiator and a polymer binder; and developing the exposed printing plate with a developing solution containing (1) an inorganic alkali agent and (2) a nonionic surface active agent having a polyoxyalkylene ether group.

DETAILED DESCRIPTION OF THE INVENTION

In accordance with the plate-making method of a lithographic printing plate of the present invention, not only degradation of developing characteristics due to the lapse of time and/or repeated use of the developing solution is prevented, but also good developability is constantly achieved in the non-image area so that no stain occurs in printing and damage to the image area by the development is small to provide an image having excellent strength.

Further, according to the plate-making method of a lithographic printing plate of the present invention, it is possible to prepare a printing plate free from printing stain and excellent in press life, and the method is preferred in view of safety since a pH of the developing solution is relatively low and enables to improve the influence of waste liquid of the developing solution upon the environment.

The plate-making method of a lithographic printing plate of the present invention will be described in greater detail below.

First, a novel developing solution for use in the plate-making method of a lithographic printing plate of the present invention, which is one feature of the plate-making method of the present invention, is described below.

The developing solution for use in the present invention is an aqueous alkali solution containing at least (1) an inorganic alkali agent and (2) a nonionic surface active agent having a polyoxyalkylene ether group.

Examples of the inorganic alkali agent (1) include sodium tertiary phosphate, potassium tertiary phosphate, ammonium tertiary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, potassium hydroxide, ammonium hydroxide and lithium hydroxide.

For the purpose of minute control of the alkali concentration or assisting dissolution of the photosensitive layer, an organic alkali agent may be supplementally used together with the inorganic alkali agent. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammonium hydroxide.

The alkali agents may be used individually or as a mixture of two or more thereof.

The alkali agent is employed in an amount so that a pH of the developing solution is in a range of from 9 to 13.5 and an electric conductivity thereof is in a range of from 2 to 40 mS/cm. A preferred range of the pH is from 10.0 to 12.5. A preferred range of the electric conductivity is from 3 to 30 mS/cm and more preferably from 5 to 20 mS/cm.

When the pH of developing solution is lower than the above-described range, images are hardly formed. On the other hand, when the pH of developing solution is higher than the above-described range, the development proceeds excessively and damage due to the development increases in the exposed area.

When the dielectric constant of developing solution is lower than the above-described range, it ordinarily becomes difficult to dissolve the photosensitive composition on a surface of aluminum plate support, thereby accompanying with printing stain. On the other hand, when the dielectric constant of developing solution is higher than the above-described range, a dissolving speed of the photosensitive layer conspicuously decreases, whereby residual film occurs in the unexposed area.

It is also essential for the developing solution according to the present invention to contain the nonionic surface active agent having a polyoxyalkylene ether group (2). By the addition of nonionic surface active agent, dissolution of the photosensitive layer in the unexposed area is accelerated and penetration of the developing solution can be restrained in the exposed area.

As the nonionic surface active agent having a polyoxyalkylene ether group, a compound represented by formula (I) shown below is preferably used.

$$R^1\text{—}O\text{—}(R^2\text{—}O)_n H \qquad (I)$$

In formula (I), $R^1$ represents an alkyl group having from 3 to 15 carbon atoms which may be substituted, an aromatic hydrocarbon group having from 6 to 15 carbon atoms which may be substituted or an aromatic heterocyclic group having from 4 to 15 carbon atoms which may be substituted, wherein the substituent includes an alkyl group having from 1 to 20 carbon atoms, a halogen atom such as bromine, chlorine or iodine, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms; $R^2$ represents an alkylene group having from 1 to 100 carbon atoms which may be substituted, wherein the substituent includes an alkyl group having from 1 to 20 carbon atoms and an aromatic hydrocarbon group having from 6 to 15 carbon atoms; and n represents an integer of from 1 to 100.

The part of $(R^2\text{—}O)_n$ in formula (I) may comprise two or three kinds of groups as far as $R^2$ and n are in the above-defined scope. Specifically, it may form a random or block chain comprising, for example, a combination of an ethyleneoxy group and a propyleneoxy group, a combination of an oxyethyleneoxy group and an isopropyleneoxy group, a combination of an ethyleneoxy group and butyleneoxy group or a combination of an ethyleneoxy group and isobutyleneoxy group.

In the present invention, the nonionic surface active agents having a polyoxyalkylene ether group may be used individually or as a mixture of two or more thereof. An amount of the nonionic surface active agent having a polyoxyalkylene ether group effectively added is from 1 to 30% by weight, preferably from 2 to 20% by weight in the developing solution.

If the amount added is too small, the developing property degrades, and on the other hand, if it is too large, the damage due to development in the exposed area increases, resulting in decrease of press life of a printing plate.

Other surface active agents described below may be added to the developing solution according to the present invention. Examples of the other surface active agents usable include a nonionic surface active agent, for example, a polyoxyethylene alkyl ether, e.g., polyoxyethylene lauryl ether, polyoxyethylene cetyl ether or polyoxyethylene stearyl ether, a polyoxyethylene alkylaryl ether, e.g., polyoxyethylene octylphenyl ether or polyoxyethylene nonylphenyl ether, a polyoxyethylene alkyl ester, e.g., polyoxyethylene stearate, a sorbitan alkyl ester, e.g., sorbitan monolaurate, sorbitan monostearate, sorbitan distearate, sorbitan monooleate, sorbitan sesquioleate or sorbitan trioleate, or a mono glyceride alkyl ester, e.g., glycerol monostearate or glycerol monooleate; an anionic surface active agent, for example, an alkylbenzenesulfonate, e.g., sodium dodecylbenzenesulfonate, an alkylnaphthalenesulfonate, e.g., sodium butylnaphthalenesulfonate, sodium pentylnaphthalenesulfonate, sodium hexylnaphthalenesulfonate or sodium octylnaphthalenesulfonate, an alkylsulfate, e.g., sodium laurylsulfate, an alkylsulfonate, e.g., sodium dodecylsulfonate, or a sulfosuccinate, e.g., sodium dilaurylsulfosuccinate; and an amphoteric surface active agent, for example, an alkylbetaine, e.g., laurylbetaine or stearylbetaine, or an amino acid. An anionic surface active agent such as an alkylnaphthalenesulfonate is particularly preferred.

These surface active agents may be used individually or as a mixture of two or more thereof. A content of such a surface active agent is preferably from 0.1 to 20% by weight in the developing solution.

In the developing solution according to the present invention, other components described below may be used together with the components described above, if desired. Examples of such components include an organic carboxylic acid, e.g., benzoic acid, phthalic acid, p-ethylbenzoic acid, p-n-propylbenzoic acid, p-isopropylbenzoic acid, p-n-butylbenzoic acid, p-tert-butylbenzoic acid, p-2-hydroxyethylbenzoic acid, decanoic acid, salicylic acid or 3-hydroxy-2-naphtoic acid; an organic solvent, e.g., isopropyl alcohol, benzyl alcohol, ethyl cellosolve, butyl cellosolve, phenyl cellosolve, propylene glycol or diacetone alcohol; a chelating agent, a reducing agent, a dye, a pigment, a water-softener, an antiseptics and a defoaming agent.

Now, the photosensitive lithographic printing plate for use in the present invention is described in detail below.

The photosensitive composition of photopolymerization type, which constitutes the photosensitive layer of photosensitive lithographic printing plate for use in the present invention, contains as the essential components, a compound having a nitrogen atom and an ethylenically unsaturated double bond, a photopolymerization initiator (also simply referred to as a photo-initiator hereinafter) and a polymer binder. If desired, various compounds, for example, a coloring agent, a plasticizer or a thermal polymerization inhibitor are used together in the photosensitive composition.

The ethylenically unsaturated compound is a compound having an ethylenically unsaturated bond capable of conducting addition-polymerization upon the function of a photopolymerization initiator when the photosensitive composition of photopolymerization type is irradiated with an active ray, thereby causing crosslinking or hardening. In the present invention, the ethylenically unsaturated compound having a nitrogen atom in the molecule thereof is used.

The compound having an addition-polymerizable ethylenic double bond can be appropriately selected from compounds having at least one terminal ethylenically unsaturated bond, preferably compounds having two or more terminal ethylenically unsaturated bonds.

Examples of the compound include a compound having the chemical form of a monomer, a prepolymer such as a dimer, a trimer or an oligomer, a mixture thereof and a copolymer thereof.

Examples of the ethylenically unsaturated compound having a nitrogen atom include an amide of an unsaturated carboxylic acid (for example, acrylic acid, methacrylic acid, itaconic acid, crotonic acid, isocrotonic acid or maleic acid) and preferably an amide of an unsaturated carboxylic acid with an aliphatic polyamine compound. Also, an unsaturated carboxylic acid ester having a hydroxy group or a nucleophilic substituent, for example, an amino group or a mercapto group and an addition reaction product of an amide with a monofunctional or polyfunctional isocyanate are preferably used. Further, an addition reaction product of an unsaturated carboxylic acid ester or amide having an isocyanato group with a monofunctional or polyfunctional alcohol, amine or thiol and a substitution reaction product of an unsaturated carboxylic acid ester or amide having an isocyanato group with a monofunctional or polyfunctional amine having a releasable substituent, for example, a halogen atom or a tosyloxy group are preferably used. Moreover, compounds in which the unsaturated carboxylic acid described above is substituted with an unsaturated phosphonic acid, styrene or vinyl ether may be used.

A particularly preferred addition-polymerizable compound having at least one ethylenically unsaturated double bond is a urethane series addition-polymerizable compound prepared by utilizing an addition reaction of an isocyanate with a hydroxy group.

Specific examples of such a compound include a vinyl urethane compound having at least two polymerizable vinyl groups in the molecule thereof obtained by subjecting addition of a vinyl monomer having a hydroxy group represented by formula (II) shown below to a polyisocyanate compound having at least two isocyanato groups in the molecule thereof as described in JP-B-48-41708 (the term "JP-B" as used herein means an "examined Japanese patent publication").

$$CH_2=C(R)COOCH_2CH(R')OH \qquad (II)$$

wherein R and R', which may be the same or different, each represents a hydrogen atom or a methyl group.

Also, examples thereof include urethane (meth)acrylates as described in JP-A-51-37193, JP-B-2-32293 and JP-B-2-16765 and urethane compounds having an ethylene oxide skeleton as described in JP-B-58-49860, JP-B-56-17654, JP-B-62-39417 and JP-B-62-39418.

Specific examples of particularly preferred compound include reaction products of a polyisocyanate compound of Group (1) with an alcohol compound of Group (2) shown below.

Group (1)

(2,4- and 2,6-compounds)

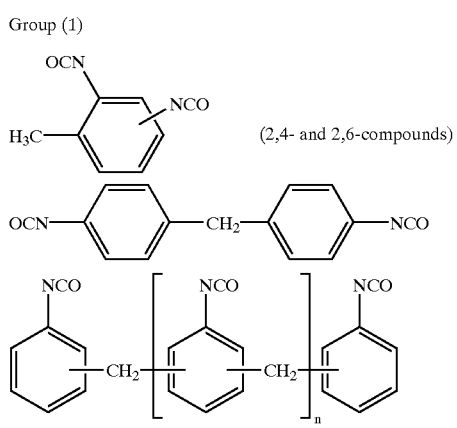

$n$: 0 or an interger of 1 or more

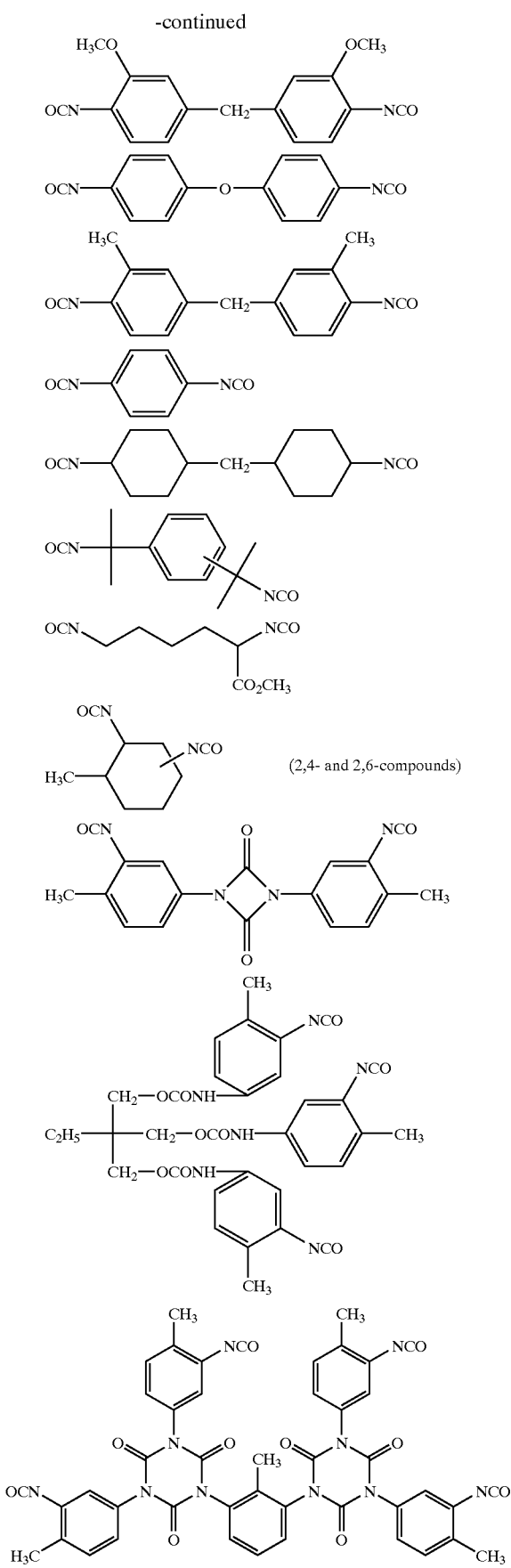
(2,4- and 2,6-compounds)
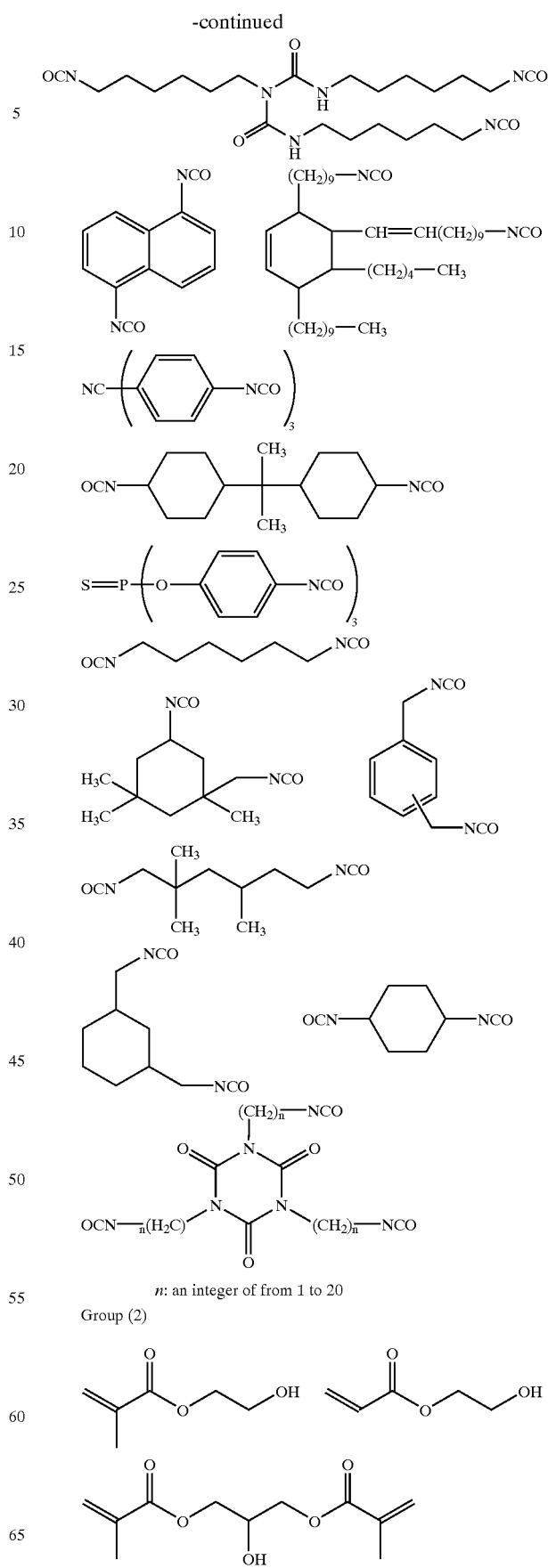
n: an integer of from 1 to 20
Group (2)

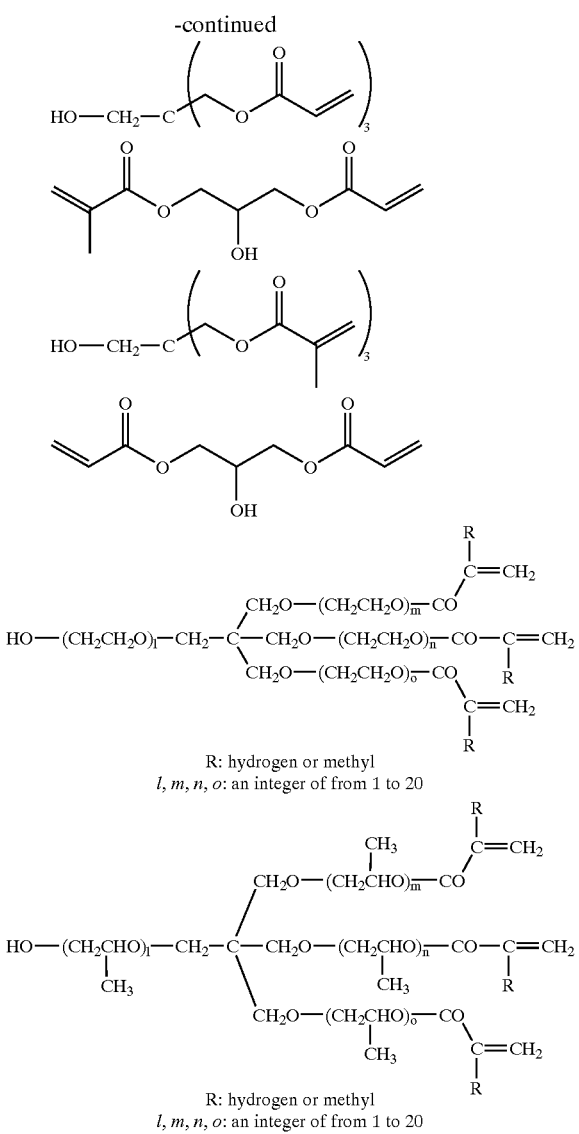

R: hydrogen or methyl
l, m, n, o: an integer of from 1 to 20

R: hydrogen or methyl
l, m, n, o: an integer of from 1 to 20

Further, specific compounds include the following commercially available compounds: Urethaneacrylate M-1100, M-1200, M-1210 and M-1300 manufactured by Toagosei Co., Ltd., Urethaneacrylate EB210, EB4827, EB6700 and EB220 manufactured by Daicel-UCB Co., Ltd., Uvithane-782, Uvithane-783, Uvithane-788 and Uvithane-893 manufactured by Morton Thiokol Inc., Artresin UN-9000EP, Artresin UN-9200A, Artresin UN-900H, Artresin UN-1255, Artresin UN-5000, Artresin UN-2111A, Artresin UN-2500, Artresin UN-3320HA, Artresin UN-3320HB, Artresin UN-3320HC, Artresin UN-3320HS, Artresin UN-6060P, Artresin UN-6060PTM, Artresin SH-380G, Artresin SH-500 and Artresin SH-9832 manufactured by Negami Chemical Industrial Co., Ltd., NK Oligo U-4H, NK Oligo U-4HA, NK Oligo U-4P, NK Oligo U-4PA, NK Oligo U-4TX, NX Oligo U-4TXA, NE Oligo U-6LHA, NK Oligo U-6LPA-N, NK Oligo U-6LTXA, NK Oligo UA-6ELP, NK Oligo A-6ELH, NK Oligo UA-6ELTX, NK Oligo UA-6PLP, NK Oligo U-6-ELP, NK Oligo U-6ELH, NK Oligo U-8MDA, NK Oligo U-8MD, NK Oligo U-12LMA, NK Oligo U-12LM, NX Oligo U-6HA, NK Oligo U-108A, NK Oligo U-1084A, NK Oligo U-200AX, NK Oligo U-122A, NK Oligo U-340A, NX Oligo U-324A and NK Oligo UA-100 manufactured by Shin-Nakamura Chemical Co., Ltd., AH-600, AT-600, UA-306H, AI-600, UA101T, UA101I, UA101H, UA-306T, UA-306I, UF-8001 and UF-8003 manufactured by Kyoeisha Chemical Co., Ltd.

Specific examples of monomer of the amide of an unsaturated carboxylic acid with an aliphatic polyamine compound include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other preferred examples of the amide monomer include those having a cyclohexylene structure as described in JP-B-54-21726.

As the ethylenically unsaturated compound having a nitrogen atom for use in the present invention, a reaction product of a monoisocyanate or diisocyanate with a partial ester of a polyhydric alcohol as described, for example, in West German Patents 2,064,079, 2,361,041 and 2,822,190 are also advantageously used.

Further, an unsaturated compound containing a thio group which may be a member for constituting a hetero ring, a ureido group, a urethane group, an amino group such as triethanolamino group or triphenylamino group, a thiourea group, an imidazole group, an oxazole group, a thiazole group, an N-phenylglycine group or a photo-oxidizing group such as an ascorbic acid group in the molecular structure thereof is preferably employed. Examples of such a type of compound are described in European Patents 287,818, 353, 389 and 384,735. Of these compounds, those containing a tertiary amino group, a ureido group or a urethane group are preferred.

The ethylenically unsaturated compounds having a nitrogen atom may be used individually or as a mixture of two or more thereof. Also, they may be used together with a known unsaturated compound, for example, a monomer of an ester of an unsaturated carboxylic acid with a polyhydric alcohol compound described below.

Specific examples of monomer of the ester of an unsaturated carboxylic acid with an aliphatic polyhydric alcohol compound include an acrylic ester, e.g., ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri (acryloyloxyethyl)isocyanurate or polyester acrylate oligomer; a methacrylic ester, e.g., tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate dipentaerythritol pentamethacrylate, sorbitol trimethacrylate, sorbitol tetramethacrylate, bis-[p-(3-methacryloxy-2-hydroxypropoxy)phenyl]dimethylmethane or bis-[p-(methacryloxyethoxy)phenyl]dimethylmethane; an itaconic ester, e.g., ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate; a crotonic ester, e.g., ethylene glycol dicrotonate, tetramethylene glycol dicrotonate, pentaerythritol dicrotonate or sorbitol tetracrotonate; an isocrotonic ester, e.g., ethylene glycol diisocrotonate, pentaerythritol diisocrotonate or sorbitol tetraisocrotonate; and a maleic ester, e.g., ethylene glycol dimaleate, triethylene glycol dimaleate, pentaerythritol dimaleate or sorbitol tetramaleate.

Also, a polyfunctional acrylate or methacrylate, for example, a polyester acrylate or a epoxy acrylate obtained by reacting an epoxy resin with (meth)acrylic acid as described in JP-A-48-64183, JP-B-49-43191 and JP-B-52-30490 is employed. Further, photo-curing monomers and oligomers as described in Nippon Setchaku Kyoukaishi, Vol. 20, No. 7, pages 300 to 308 (1984) are employed.

The ethylenically unsaturated compound is used in an amount of from 5 to 80% by weight, preferably from 30 to 70% by weight, based on the whole composition of the photosensitive layer.

The photopolymerization initiator incorporated into the photosensitive layer of the photosensitive lithographic printing plate according to the present invention can be appropriately selected from various kinds of known photo-initiators described in patents and literature depending on a wavelength of light source to be used. A combination of two or more photo-initiators (photo-initiator system) is also used. Specific examples thereof are set forth below, but the present invention should not be construed as being limited thereto.

In case of using visible light having a wavelength of 400 nm or more an Ar laser, a second harmonic wave of a semiconductor laser or an SHG-YAG laser as the light source, various photo-initiators have been proposed. For instance, a certain kind of photo-reducing dyes as described in U.S. Pat. No. 2,850,445, for example, Rose Bengale, Eosine or erythrosine, and a combination system comprising a dye and a photo-initiator, for example, a composite photo-initiator system comprising a dye and an amine as described in JP-B-44-20189, a combination of a hexaarylbiimidazole, a radical generator and a dye as described in JP-B-45-37377, a combination of a hexaarylbiimidazole and a p-dialkylaminobenzylidene ketone as described in JP-B-47-2528 and JP-A-54-155292, a combination of a cyclic cis-α-dicarbonyl compound and a dye as described in JP-A-48-84183, a combination of a cyclic triazine and a merocyanine dye as described in JP-A-54-151024, a combination of a 3-ketocoumarin and an activator as described in JP-A-52-112681 and JP-A-58-15503a combination of a biimidazole, a styrene derivative and a thiol as described in JP-A-59-140203 a combination of an organic peroxide and a dye as describe in JP-A-59-1504, JP-A-59-140203, JP-A-59-189340, JP-A-62-174203, JP-B-62-1641 and U.S. Pat. No. 4,766,055, a combination of a dye and an active halogen compound as described in JP-A-63-258903 and JP-A-2-63054, a combination of a dye and a borate compound as described in JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348 and JP-A-1-138204, a combination of a dye having a rhodanine ring and a radical generator as described in JP-A-2-179643 and JP-A-2-244050, a combination of a titanocene and a 3-ketocoumarin dye as described in JP-A-63-221110, a combination of a titanocene, a xanthene dye and an addition-polymerizable ethylenically unsaturated compound having an amino group or a urethane group as described in JP-A-4-221958 and JP-A-4-219756, a combination of a titanocene and a specific merocyanine dye as described in JP-A-6-295061, or a combination of a titanocene and a dye having a benzopyran ring as described in JP-A-8-334897 are illustrated.

In recent years, with the development of a laser having a wavelength of from 400 to 410 nm (a violet laser) a photo-initiator system having high sensitivity to a wavelength of 450 nm or less sensitive to such a laser has been developed. Such a photo-initiator system can also be used in the present invention.

For example, a combination of a cationic dye and a borate as described in JP-A-11-84647, a combination of a merocyanine dye and a titanocene as described in JP-A-2000-147763 and a combination of a carbazole dye and a titanocene as described in Japanese Patent Application No. 11-221480 are illustrated.

In the present invention, the system comprising a titanocene compound is particularly preferred, since it is excellent in sensitivity.

Various kinds of titanocene compounds can be used and, for example, they are appropriately selected from those described in JP-A-59-152396 and JP-A-61-151197. Specific examples thereof include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,6-difluorophen-1-yl and dicyclopentadienyl-Ti-bis-2,6-difluoro-3-(pyr-1-yl)-phen-1-yl.

It is known that a photo-initiating function is more improved by adding a hydrogen-donating compound, for example, a thiol compound, e.g., 2-mercaptobenzothiazole, 2-mercaptobenzimidazole or 2-mercaptobenzoxazole, or an amine compound, e.g., N-phenylglycine or an N,N-dialkylamino aromatic alkyl ester to the photo-initiators described above, if desired. parts by weight, and more preferably from 0.2 to 50 parts by weight, per 100 parts by weight of the ethylenically unsaturated compound.

The polymer binder for use in the photosensitive layer of the photosensitive lithographic printing plate according to the present invention not only acts as a film-forming agent of the photosensitive layer but also must be soluble in an alkali developing solution. Thus, an organic polymer soluble or swellable in an aqueous alkali solution is ordinarily employed as the polymer binder.

Examples of such an organic polymer include an addition polymer having a carboxylic acid group in the side chain, for example, polymers described in JP-A-59-44615, JP-B-54-34327, JP-B-58-12577, JP-B-54-25957, JP-A-54-92723, JP-A-59-53836 and JP-A-59-71048, that is, a methacrylic acid copolymer, an acrylic acid copolymer, an itaconic acid copolymer, a crotonic acid copolymer, a maleic acid copolymer and a partially esterified maleic acid copolymer.

An acid cellulose derivative having a carboxylic acid group in the side chain is also used. Further, a polymer obtained by adding a cyclic acid anhydride to an addition polymer having a hydroxy group is useful. Of these polymers, a copolymer of benzyl (meth)acrylate, (meth)acrylic acid and if desired, other addition-polymerizable vinyl monomer and a copolymer of allyl (meth)acrylate, (meth)acrylic acid and if desired, other addition-polymerizable vinyl monomer are particularly preferably used. In addition, polyvinyl pyrrolidone and polyethylene oxide are useful as the water-soluble organic polymer. In order to increase strength of a cured film, an alcohol-soluble polyamide and a polyether of 2,2-bis-(4-hydroxyphenyl) propane with epichlorohydrin are also useful.

Polyurethane resins as described in JP-B-7-120040, JP-B-7-120041, JP-B-7-120042, JP-B-8-12424, JP-A-63-287944, JP-A-63-287947, JP-A-1-271741 and JP-A-11-352691 are also useful for use in the present invention.

By introducing a radical reactive group into the side chain of the organic polymer, the strength of a cured film formed therefrom can be increased. For example, a group having an ethylenically unsaturated bond, an amino group or an epoxy group is illustrated as an addition-polymerizable functional group, a mercapto group, a thiol group, a halogen atom, a triazine structure or an onium salt structure is illustrated as a functional group capable of forming a radical upon irradiation, and a carboxy group or an imido group is illustrated as a polar group. Of the addition-polymerizable functional groups, an ethylenically unsaturated group such as an acryl group, a methacryl group, allyl group or a styryl group is particularly preferred. A functional group selected from an amino group, a hydroxy group, a phosphonic acid group, a phosphoric acid group, a carbamoyl group, an isocyanato group, a ureido group, a ureylene group, a sulfonic acid group and an ammonium group is also useful.

In order to maintain the developing property of the composition for the photosensitive layer, it is preferred that the polymer binder for use in the present invention has an appropriate molecular weight and acid value. Specifically, the polymer binder having a weight average molecular weight of from 5,000 to 300,000 and an acid value of from 20 to 200 is effectively used.

The organic polymer binder can be mixed in an appropriate amount in the entire composition for the photosensitive layer. When the amount of polymer binder exceeds 90% by weight, it may be difficult to obtain sufficient strength of image formed. The amount is preferably from 10 to 90% by weight, more preferably from 30 to 80% by weight of the composition for the photosensitive layer. It is preferred that a ratio of the photo-polymerizable ethylenically unsaturated compound to the organic polymer binder is in a range of from 1/9 to 9/1 by weight. The range is more preferably from 2/8 to 8/2 by weight, and still more preferably from 3/7 to 7/3 by weight.

It is preferred to add a small amount of a thermal polymerization inhibitor in addition to the fundamental components described above to the photosensitive composition for the photosensitive layer in order to prevent undesirable thermal polymerization of the photo-polymerizable ethylenically unsaturated compound during the production and storage of the photosensitive composition in the present invention. Suitable examples of the thermal polymerization inhibitor include hydroquinone, p-methoxyphenol, di-tert-butyl-p-cresol, pyrogallol, tert-butylcatechol, benzoquinone, 4,4'-thiobis-(3-methyl-6-tert-butylphenol), 2,2'-methylenebis-(4-metyl-6-tert-butylphenol), N-nitrosophenylhydroxylamine primary cerium salt and N-nitrosophenylhydroxylamine aluminum salt. The amount of the thermal polymerization inhibitor added is preferably from about 0.01 to about 5% by weight based on the solid content of photosensitive composition. Further, a higher fatty acid or a derivative thereof such as behenic acid or behenic amide may be added to the photosensitive composition and localized on the surface of the photosensitive layer during a drying process after coating in order to prevent polymerization hindrance due to oxygen, if desired. The amount of higher fatty acid or derivative thereof added is preferably from about 0.5 to about 10% by weight based on the solid content of photosensitive composition.

A coloring agent may further be added for the purpose of coloring the photosensitive layer. Examples of the coloring agent include a pigment, for example, a phthalocyanine pigment, e.g., C. I. Pigment Blue 15:3, 15:4 or 15:6, an azo pigment, carbon black or titanium oxide, and a dye, for example, Ethyl Violet, Crystal Violet, an azo dye, an anthraquinone dye or a cyanine dye. The amount of the coloring agent added is preferably from about 0.5 to about 20% by weight based on the total weight of photosensitive composition.

In addition, an additive, for example, an inorganic filler or a plasticizer, e.g., dioctyl phthalate, dimethyl phthalate or tricresyl phosphate may be added in order to improve physical properties of the cured film. The amount of such an additive added is preferably not more than 10% by weight based on the total weight of photosensitive composition.

The composition for the photosensitive layer of the photosensitive lithographic printing plate according to the present invention is dissolved in an organic solvent and coated on a support described hereinafter. Various kinds of solvents can be used and examples thereof include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The organic solvents may be used individually or as a mixture of two or more thereof. The concentration of the solid content in the coating solution is suitably from 1 to 50% by weight.

A surface active agent may be added to the photopolymerizable composition for the photosensitive layer of the photosensitive lithographic printing plate according to the present invention in order to improve surface properties of coating.

The dry coating amount of photosensitive layer is preferably from about 0.1 to about 10 $g/m^2$, more preferably from 0.3 to 5 $g/m^2$, and still more preferably from 0.5 to 3 $g/m^2$.

On the photosensitive layer described above, an oxygen-isolating protective layer is ordinarily provided in order to prevent from a polymerization inhibiting function of oxygen.

A water-soluble vinyl polymer, which is incorporated into the oxygen-isolating protective layer, includes polyvinyl alcohol and a copolymer thereof containing a substantial amount of unsubstituted vinyl alcohol unit sufficient for imparting the desired solubility in water, for example, a partial ester, ether or acetal of polyvinyl alcohol. Polyvinyl alcohol that has a hydrolyzing rate of from 71 to 100% and a polymerization degree of from 300 to 2,400 is used. Specific examples thereof include PVA-105, PVA-110, PVA-117, PVA-117H, PVA-120, PVA-124, PVA-124H, PVA-CS, PVA-CST, PVA-HG, PVA-203, PVA-204, PVA-205, PVA-210, PVA-217, PVA-220, PVA-224, PVA-217EE, PVA-217E, PVA-220E, PVA-224E, PVA-405, PVA-420, PVA-631 and L-8 manufactured by Kuraray Co., Ltd.

Examples of the copolymer include polyvinyl acetate, polyvinyl chloroacetate, polyvinyl propionate, polyvinyl formal and polyvinyl acetal hydrolyzed from 80 to 100%. Other useful polymers include polyvinyl pyrrolidone, gelatin and gum arabic. The water-soluble polymers may be used individually or as a mixture of two or more thereof.

A solvent, which is used for coating the oxygen-isolating protective layer in the photosensitive lithographic printing plate according to the present invention, is preferably pure water, however, an alcohol, e.g., methanol or ethanol, or a ketone, e.g., acetone or methyl ethyl ketone may be used together with pure water. The concentration of the solid content in the coating solution is suitably from 1 to 20% by weight.

To the oxygen-isolating protective layer according to the present invention, known additives, for example, a surface active agent for improving coating properties or a water-soluble plasticizer for improving physical properties of the film may be further added.

Examples of the water-soluble plasticizer include propionamide, cyclohexanediol, glycerol and sorbitol. A water-soluble (meth)acrylic polymer may also be used.

The dry coating amount of oxygen-isolating protective layer is preferably in a range of from about 0.1 to about 15 $g/m^2$, more preferably from 1.0 to about 5.0 $g/m^2$.

Now, the support of photosensitive lithographic printing plate according to the present invention is described in detail below.

The aluminum support for use in the present invention, which is dimensionally stable, includes an aluminum or aluminum alloy (for example, alloy of aluminum with silicon, copper, manganese, magnesium, chromium, zinc, lead, bismuth or nickel) plate, and a plastic film or paper laminated or deposited with aluminum or aluminum alloy. The thickness of support is ordinarily from about 0.05 to about 1 mm. A composite sheet as described in JP-A-48-18327 is also used.

The aluminum support for use in the present invention is appropriately subjected to surface treatment as described below.

<Graining Treatment>

A method for the graining treatment used includes a mechanical graining method, a chemical graining method and an electrolytic graining method as described in JP-A-56-28893. Specifically, an electrochemical graining method wherein surface graining is electrochemically conducted in an electrolytic solution of hydrochloric acid or nitric acid, and a mechanical graining method, for example, a wire brush graining method wherein a surface of aluminum plate is scratching with a wire brush, a ball graining method wherein a surface of aluminum plate is grained with abrasive balls and an abrasive or a brush graining method wherein a surface of aluminum plate is grained with a nylon brush and an abrasive may also be employed. The graining methods may be used individually or in combination of two or more thereof.

Of these methods, a surface graining method preferably used in the present invention is the electrochemical graining method wherein surface graining is electrochemically conducted in an electrolytic solution of hydrochloric acid or nitric acid. The current density suitable for use is in a range of from 100 to 400 $C/dm^2$. More specifically, it is preferred to perform electrolysis in an electrolytic solution containing from 0.1 to 50% of hydrochloric acid or nitric acid under the conditions of a temperature of from 20 to 100° C., a period of from one second to 30 minutes and a current density of from 100 to 400 $C/dm^2$.

The aluminum support subjected to the surface graining treatment is then chemically etched with an acid or an alkali. The method of using an acid as an etching agent takes time for destroying fine structures and thus, it is disadvantageous to industrially apply the method to the present invention. Such disadvantage can be overcome by using an alkali as the etching agent.

Examples of the alkali agent preferably used in the present invention include sodium hydroxide, sodium carbonate, sodium aluminate, sodium metasilicate, sodium phosphate, potassium hydroxide and lithium hydroxide. Preferred ranges of concentration and temperature are form 1 to 50% and 20 to 100° C., respectively. The alkali etching is preferably performed so that a dissolution amount of aluminum is in a range of from 5 to 20 $g/m^3$.

After the etching procedure, the support is subjected to washing with an acid for removing smut remaining on the surface of support. Examples of the acid for use in the acid-washing step include nitric acid, sulfuric acid, phosphoric acid, chromic acid, hydrofluoric acid and borofluoric acid. As the method for removing smut after the electrochemical graining treatment, a method of bringing the aluminum support into contact with a 15 to 65% by weight aqueous solution of sulfuric acid having a temperature of from 50 to 90° C. as described in JP-A-53-12739 and a method of performing alkali etching as described in JP-B-48-28123 are particularly preferred.

The surface roughness (Ra) of aluminum support preferably used in the present invention is in a range of from 0.3 to 0.7 μm.

<Anodizing Treatment>

The aluminum support thus-treated is then subjected to anodizing treatment.

The anodizing treatment can be conducted in a manner conventionally used in the field of art. Specifically, it is performed by applying a direct current or alternating current to the aluminum support in an aqueous solution or non-aqueous solution containing sulfuric acid, phosphoric acid, chromic acid, oxalic acid, sulfamic acid, benzenesulfonic acid, or a combination of two or more thereof to form an anodic oxide layer on the surface of aluminum support.

The conditions of anodizing treatment cannot be determined generally, since they vary widely depending on an electrolytic solution to be used. However, ordinarily, a concentration of the electrolytic solution is in a range of from 1 to 80%, a temperature of the electrolytic solution is in a range of from 5 to 70° C., a current density is in a range of from 0.5 to 60 $A/dm^2$, a voltage is in a range of from 1 to 100 V, and a period of electrolysis is in a range of from 10 to 100 seconds.

Of the anodizing treatments, a method of anodizing in a sulfuric acid solution with a high current density as described in British Patent 1,412,768 and a method of anodizing using phosphoric acid as an electrolytic bath as described in U.S. Pat. No. 3,511,661 are preferably used.

In the present invention, the thickness of anodic oxide layer is preferably from 1 to 10 $g/m^2$. When the thickness is less than 1 $g/m^2$, the printing plate is liable to be injured, and on the other hand, when the thickness is more than 10 $g/m^2$, a large quantity of electric power is necessary and thus economically disadvantageous. The thickness of anodic oxide layer is more preferably from 1.5 to 7 $g/m^2$, and still more preferably from 2 to 5 $g/m^2$.

In the present invention, the aluminum support may further be subjected to sealing treatment of the anodic oxide layer after the graining treatment and anodizing treatment. The sealing treatment is performed by immersing the aluminum support in hot water or a hot aqueous solution containing an inorganic salt or an organic salt, or transporting in a water vapor bath. Moreover, the aluminum support may be subjected to surface treatment, for example, silicate treatment with an alkali metal silicate or immersion in an aqueous solution of potassium fluorozirconate or a phosphate.

On the aluminum support subjected to the surface treatment as described above, the photosensitive layer comprising the photopolymerizable composition described above is coated to prepare the photosensitive lithographic printing plate according to the present invention. Before the coating of photosensitive layer, an organic or inorganic undercoat layer may be provided on the support, if desired.

The photosensitive layer of the photosensitive lithographic printing plate according to the present invention is exposed imagewise with a conventionally known active ray, for example, a carbon arc lamp, a high-pressure mercury lamp, a xenon lamp, a metal halide lamp, a fluorescent lamp, a tungsten lamp, a halogen lamp, a helium-cadmium laser, an argon ion laser, an FD-YAG laser, a helium-neon laser or a semiconductor laser (350 to 600 nm), and then subjected to development processing with the developing solution described above to form images on the surface of aluminum support.

After the imagewise exposure but before the development the lithographic printing plate may be subjected to heating at a temperature of from 50 to 150° C. for a period of from one second to 5 minutes for the purpose of increasing the curing rate of photo-polymerizable photosensitive layer.

The photosensitive lithographic printing plate according to the present invention has ordinarily the oxygen-isolating protective layer (an overcoat layer) as described above on the photosensitive layer. In order to remove the overcoat layer, there are a method wherein removal of the overcoat layer and removal of the photosensitive layer in the unexposed area are carried out at the same time using the developing solution according to the present invention and a method wherein the overcoat layer is first removed with water or warm water and then the photosensitive layer in the unexposed area is removed by the development. To the water or warm water, for example, an antiseptics as described in JP-A-10-10754 or an organic solvent as described in JP-A-8-278636 may be incorporated.

The development of photosensitive lithographic printing plate with the developing solution according to the present invention is carried out at a temperature of from about 0 to about 60° C., preferably from about 15 to about 40° C. in a conventional manner, for example, that the imagewise exposed photosensitive lithographic printing plate is immersed in the developing solution and rubbed with a brush.

When the development processing is performed using an automatic processing machine, the processing ability of the developing solution may be recovered using a replenisher or a fresh developing solution, since the developing solution becomes exhausted with the increase in processing amount.

The photosensitive lithographic printing plate thus-processed is subjected to post-treatment with washing water, a rinsing solution containing a surface active agent or a desensitizing solution containing gum arabic or a starch derivative as described, for example, in JP-A-54-8002, JP-A-55-115045 and JP-A-59-58431. These processes may be used in various combinations for the post-treatment of photosensitive lithographic printing plate according to the present invention.

The printing plate obtained by the development processing described above can be increased its press life using post-exposure treatment by a method as described in JP-A-2000-89478 or heat treatment, for example, burning.

The lithographic printing plate obtained by the processes described above is mounted on an offset printing machine to perform printing, whereby a large number of prints are obtained.

The present invention will be described in greater detail with reference to the following examples, but the present invention should not be construed as being limited thereto.

EXAMPLE 1

An aluminum plate of 1S having a thickness of 0.30 mm was subjected to surface graining using a nylon brush of No. 8 and an aqueous suspension of pumice stone of 800 mesh and washed thoroughly with water. The plate was etched by immersing in a 10% aqueous sodium hydroxide solution at 70° C. for 60 seconds, washed with running water, and washed with a 20% aqueous nitric acid solution for neutralization, followed by washing with water. The plate was then subjected to electrolytic surface roughening treatment in a 1% aqueous nitric acid solution using alternating waveform current of sign wave under the condition of $V_A$ of 12.7 V in an amount of electricity of 300 C/dm$^2$ at anode. The surface roughness of the plate measured was 0.45 μm (Ra). Subsequently, the plate was immersed in a 30% aqueous sulfuric acid solution at 55° C. for 2 minutes to conduct desmutting and then subjected to anodic oxidation in a 20% aqueous sulfuric acid solution at 33° C. at a current density of 5 A/dm$^2$ for 50 seconds while an cathode was arranged on the roughened surface of the plate to form an anodic oxide layer having a thickness of 2.7 g/m$^2$.

On the aluminum support thus-obtained, high-sensitive photopolymerizable composition (1) shown below was coated so as to have a dry coating weight of 1.5 g/m$^2$, and dried at 100° C. for one minute to form a photosensitive layer, whereby a photosensitive lithographic printing plate was prepared.

<Photopolymerizable Composition (1)>

| | |
|---|---|
| Compound having ethylenically unsaturated bond (A1) | 1.5 parts by weight |
| Linear organic polymer (B1) | 2.0 parts by weight |
| Sensitizer (C1) | 0.15 parts by weight |
| Photo-initiator (D1) | 0.2 parts by weight |
| Dispersion of ε-phthalocyanine (F1) | 0.02 parts by weight |
| Fluorine-containing nonionic surface active agent (Megafac F-177 manufactured by Dai-Nippon Ink & Chemicals, Inc.) | 0.03 parts by weight |
| Methyl ethyl ketone | 9.0 parts by weight |
| Propylene glycol monomethyl ether acetate | 7.5 parts by weight |
| Toluene | 11.0 parts by weight |

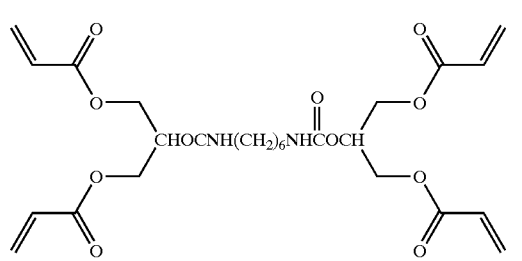

A1

-continued

Reaction product of

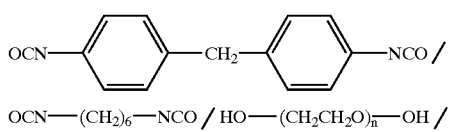

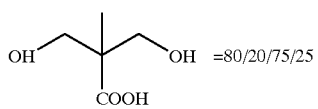

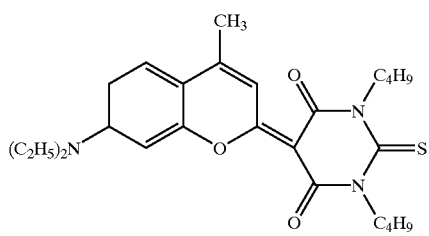 =80/20/75/25

B1

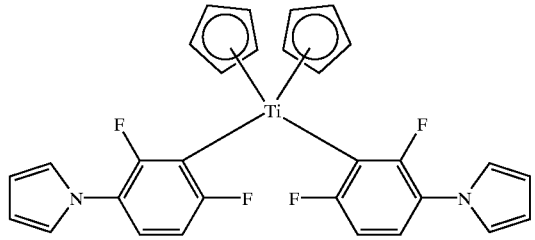

C1

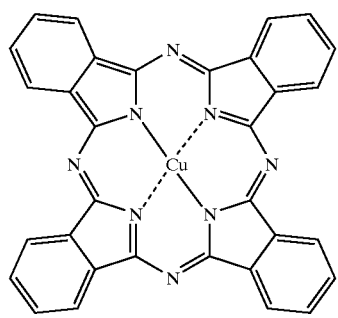

D1

F1

On the photosensitive layer was coated a 3% by weight aqueous solution of polyvinyl alcohol (saponification degree: 98%, polymerization degree: 500) so as to have a dry coating weight of 2.5 g/m², and dried at 120° C. for 3 minutes to form an overcoat layer layer, whereby a photosensitive lithographic printing plate was prepared.

The photosensitive lithographic printing plate was subjected to scanning exposure of solid image and dot images of from 1 to 99% (every 1%) using an FD-YAG laser (Plate Jet 4 manufactured by CSI Co., Ltd.) in an exposure amount of 100 μJ/cm² at 4,000 dpi under condition of 175 lines/inch, and then subjected to standard processing using an automatic developing machine (LP-850P2 manufactured by Fuji Photo Film Co., Ltd.) provided with Developing Solution 1 shown below and a finishing gum solution (FP-2W manufactured by Fuji Photo Film Co., Ltd.). The condition of pre-heating was such that a temperature of the plate surface reached was 100° C. A temperature of the developing solution was 30° C. and a period of immersion in the developing solution was about 15 seconds.

Developing Solution 1 had the composition shown below and the PH thereof was 11.5 at 25° C. and the electric conductivity thereof was 5 mS/cm.

<Composition of Developing Solution 1>

| | |
|---|---|
| Potassium hydroxide | 0.15 g |
| Polyoxyethylene phenyl ether (n = 13) | 5.0 g |
| Chelating agent (Chilest 400) | 0.1 g |
| Water | 94.75 g |

EXAMPLES 2 TO 5

Each lithographic printing plate was prepared in the same manner as in Example 1 except for changing the developing solution used in Example 1 to each of the developing solutions shown in Table 1 below.

TABLE 1

| Example 2 | |
|---|---|
| Potassium hydroxide | 0.15 g |
| Polyoxyethylene phenyl ether (n = 10) | 5.0 g |
| Chilest 400 | 0.1 g |
| Water | 94.75 g |
| PH: | 11.8 |
| Electric conductivity: | 5 mS/cm |
| Example 3 | |
| Potassium hydroxide | 0.15 g |
| Polyoxyethylene naphthyl ether (n = 10) | 5.0 g |
| Chilest 400 | 0.1 g |
| Water | 94.75 g |
| PH: | 11.7 |
| Electric conductivity: | 6 mS/cm |
| Example 4 | |
| Potassium hydroxide | 0.15 g |
| Triethanolamine | 1.35 g |
| Polyoxyethylene phenyl ether (n = 12) | 5.0 g |
| Chilest 400 | 0.1 g |
| Water | 93.4 g |
| PH: | 11.9 |
| Electric conductivity: | 6 mS/cm |
| Example 5 | |
| Potassium hydroxide | 0.2 g |
| Polyoxyethylene phenyl ether (n = 10) | 5.0 g |
| Anon LG | 1.0 g |
| Chilest 400 | 0.1 g |
| p-tert-Butylbenzoic acid | 1 g |
| Water | 92.7 g |
| PH: | 12.3 |
| Electric conductivity: | 8 mS/cm |

EXAMPLES 6 TO 9

Each lithographic printing plate was prepared in the same manner as in Example 1 except for changing Compound having ethylenically unsaturated bond (A1) and Linear organic polymer (B1) used in Example 1 to the compounds shown in Table 2 below respectively.

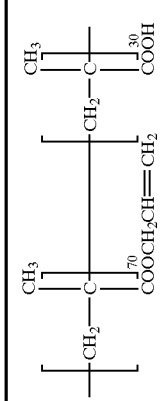

COMPARATIVE EXAMPLE 1

A developing solution was prepared in the same manner as in Developing Solution 1 of Example 1 except for eliminating polyoxyethylene phenyl ether. Using the developing solution, the plate-making of lithographic printing plate was conducted in the same manner as in Example 1.

COMPARATIVE EXAMPLE 2

A developing solution was prepared in the same manner as in Developing Solution 1 of Example 1 except for using 10 g of triethanolamine in place of 0.15 of potassium hydroxide. The pH and electric conductivity of the developing solution were 11.6 and 8 mS/cm respectively. Using the developing solution, the plate-making of lithographic printing plate was conducted in the same manner as in Example 1.

COMPARATIVE EXAMPLE 3

A developing solution containing an alkali metal silicate and an amphoteric surface active agent was prepared by diluting LP-D Developer (manufactured by Fuji Photo Film Co., Ltd.) 10 times with water. The pH and electric conductivity of the developing solution were 12.8 and 32 mS/cm respectively. Using the developing solution, the plate-making of lithographic printing plate was conducted in the same manner as in Example 1.

COMPARATIVE EXAMPLE 4

A lithographic printing plate was prepared in the same manner as in Example 1 except for changing Compound having ethylenically unsaturated bond (A1) to Compound A2 shown below.

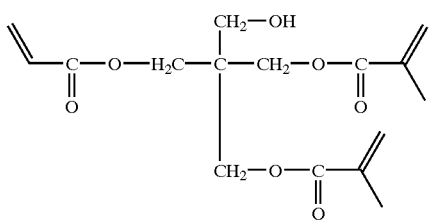

With the lithographic printing plates obtained according to the plate-making methods in Examples 1 to 9 and Comparative Example 1 to 4, developing property, press life and printing stain were evaluated. The surface of printing plate after the development processing was visually observed and the developing property was evaluated from the presence or absence of residual film and the extent of residual film. The printing plate was subjected to printing by a printing machine (R 201 Type manufactured by Man Roland Co., Ltd.) using ink (GEOS G Black (N) manufactured by Dai-Nippon Ink & Chemicals, Inc.) and the press life was evaluated from the number of sheets in which disappearance of dots of 3% was observed. The printing stain was evaluated by conducting printing by a printing machine (Dia IF2 Type manufactured by Mitsubishi Heavy Industry Co., Ltd.) using ink (GEOS G Red (S) manufactured by Dai-Nippon Ink & Chemicals, Inc.) and visually observing printing stain in the non-image area. The results obtained are shown in Table 3 below.

TABLE 3

Results of Evaluation of Printing Plate

| | Developing Property | Press Life | Printing Stain |
|---|---|---|---|
| Example 1 | No residual film | 250,000 sheets | No stain |
| Example 2 | No residual film | 280,000 sheets | No stain |
| Example 3 | No residual film | 250,000 sheets | No stain |
| Example 4 | No residual film | 250,000 sheets | No stain |
| Example 5 | No residual film | 270,000 sheets | No stain |
| Example 6 | No residual film | 200,000 sheets | No stain |
| Example 7 | No residual film | 250,000 sheets | No stain |
| Example 8 | No residual film | 300,000 sheets | No stain |
| Example 9 | No residual film | 300,000 sheets | No stain |
| Comparative Example 1 | Slight residual film | 250,000 sheets | Severe stain |
| Comparative Example 2 | Remarkable residual film | 100,000 sheets | Severe stain |
| Comparative Example 3 | No residual film | 5,000 sheets | No stain |
| Comparative Example 4 | No residual film | 80,000 sheets | No stain |

It can be seen from the results shown in Table 3 that each lithographic printing plate of the examples according to the present invention exhibits sufficient results. On the contrary, each lithographic printing plate of the comparative examples is insufficient in at least one of the results of evaluation.

As described above, the plate-making method of a lithographic printing plate according to the present invention, which use a photosensitive lithographic printing plate having a photosensitive layer comprising a photopolymerizable composition and a developing solution comprising an aqueous alkali solution having a relatively low pH and containing a nonionic surface active agent having the specific structure, is able to produce a lithographic printing plate that has good developing property and is free from printing stain and excellent in press life. Further, the developing solution is excellent in preservation stability and since the pH of the developing solution is relatively low, it is preferable in view of safety and effective on improvement in the influence of waste liquid upon environment.

While the invention has been described in detail and with reference to specific examples thereof, it will be apparent to one skilled in the art that various changes and modifications can be made therein without departing from the spirit and scope thereof.

What is claimed is:

1. A plate-making method of a lithographic printing plate, which comprises exposing imagewise a photosensitive lithographic printing plate and developing the exposed photosensitive lithographic printing plate with a developing solution, wherein the photosensitive lithographic printing plate comprises an aluminum support and a photosensitive layer comprising a photosensitive composition of photopolymerization type, the composition containing: a compound having a nitrogen atom and an ethylenically unsaturated double bond; a photopolymerization initiator; and a polymer binder; and the developing solution contains (1) an inorganic alkali agent and (2) a nonionic surface active agent having a polyoxyalkylene ether group and has a pH in a range of from 9 to 13.5 and an electric conductivity in a range of from 2 to 40 mS/cm.

2. The plate-making method of a lithographic printing plate as claimed in claim 1, wherein the nonionic surface active agent having a polyoxyalkylene ether group is a compound represented by the following formula (I):

$$R^1\text{—}O\text{—}(R^2\text{—}O)_n H \qquad (I)$$

wherein, $R^1$ represents an alkyl group having from 3 to 15 carbon atoms which may be substituted, an aromatic hydrocarbon group having from 6 to 15 carbon atoms which may be substituted or an aromatic heterocyclic group having from 4 to 15 carbon atoms which may be substituted, wherein the substituent includes an alkyl group having from 1 to 20 carbon atoms, a halogen atom such as bromine, chlorine or iodine, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms; $R^2$ represents an alkylene group having from 1 to 100 carbon atoms which may be substituted, wherein the substituent includes an alkyl group having from 1 to 20 carbon atoms and an aromatic hydrocarbon group having from 6 to 15 carbon atoms; and n represents an integer of from 1 to 100.

3. The plate-making method of a lithographic printing plate as claimed in claim 1, wherein a content of the nonionic surface active agent having a polyoxyalkylene ether group is from 1 to 30% by weight in the developing solution.

4. The plate-making method of a lithographic printing plate as claimed in claim 1, wherein the compound having a nitrogen atom and an ethylenically unsaturated double bond is a urethane series addition-polymerizable compound prepared by utilizing an addition reaction of an isocyanate with a hydroxy group.

5. The plate-making method of a lithographic printing plate as claimed in claim 1, wherein the compound having a nitrogen atom and an ethylenically unsaturated double bond is a vinyl urethane compound having at least two polymerizable vinyl groups in the molecule thereof obtained by subjecting addition of a vinyl monomer having a hydroxy group represented by formula (II) shown below with a polyisocyanate compound having at least two isocyanato groups in the molecule thereof:

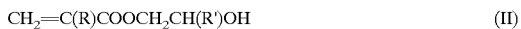

$$CH_2\text{=}C(R)COOCH_2CH(R')OH \qquad (II)$$

wherein R and R', which may be the same or different, each represents a hydrogen atom or a methyl group.

6. The plate-making method of a lithographic printing plate as claimed in claim 1, wherein the compound having a nitrogen atom and an ethylenically unsaturated double bond is an amide of an unsaturated carboxylic acid with an aliphatic polyamine compound.

7. The plate-making method of a lithographic printing plate as claimed in claim 1, wherein the compound having a nitrogen atom and an ethylenically unsaturated double bond is an ester of an unsaturated carboxylic acid with an aliphatic polyhydric alcohol compound.

8. The plate-making method of a lithographic printing plate as claimed in claim 1, wherein an amount of the compound having a nitrogen atom and an ethylenically unsaturated double bond is from 5 to 80% by weight of the whole composition of the photosensitive layer.

9. The plate-making method of a lithographic printing plate as claimed in claim 1, wherein the photopolymerization initiator comprises a titanocene compound.

10. The plate-making method of a lithographic printing plate as claimed in claim 1, wherein an amount of the photopolymerization initiator is from 0.05 to 100 parts by weight per 100 parts by weight of the compound having a nitrogen atom and an ethylenically unsaturated double bond.

11. The plate-making method of a lithographic printing plate as claimed in claim 1, wherein the polymer binder is an organic polymer soluble or swellable in an aqueous alkali solution.

12. The plate-making method of a lithographic printing plate as claimed in claim 1, wherein the polymer binder is an addition polymer having a carboxylic acid group in the side chain.

13. The plate-making method of a lithographic printing plate as claimed in claim 1, wherein the polymer binder is a cellulose derivative having a carboxylic acid group in the side chain.

14. The plate-making method of a lithographic printing plate as claimed in claim 1, wherein the polymer binder has a weight average molecular weight of from 5,000 to 300,000 and an acid value of from 20 to 200.

15. The plate-making method of a lithographic printing plate as claimed in claim 1, wherein an amount of the polymer binder is from 10 to 90% by weight of the whole composition of the photosensitive layer.

16. The plate-making method of a lithographic printing plate as claimed in claim 1, wherein the photosensitive layer further comprises a surface active agent.

17. The plate-making method of a lithographic printing plate as claimed in claim 1, wherein the photosensitive layer further comprises a coloring agent.

18. The plate-making method of a lithographic printing plate as claimed in claim 1, wherein the aluminum support comprises an aluminum or aluminum alloy plate the surface of which is subjected to graining treatment and anodizing treatment.

19. The plate-making method of a lithographic printing plate as claimed in claim 1, wherein the developing solution has a pH in a range of from 10.0 to 12.5 and an electric conductivity in a range of from 5 to 20 mS/cm.

* * * * *